United States Patent
Jung

(10) Patent No.: US 7,267,603 B2
(45) Date of Patent: Sep. 11, 2007

(54) BACK GRINDING METHODS FOR FABRICATING AN IMAGE SENSOR

(75) Inventor: Meng-An Jung, Chungcheongbuk-do (KR)

(73) Assignee: Dongbu Electroniccs Co., Ltd., Seoul (KR)

( * ) Notice: Subject to any disclaimer, the term of this patent is extended or adjusted under 35 U.S.C. 154(b) by 139 days.

(21) Appl. No.: 10/956,174

(22) Filed: Sep. 30, 2004

(65) Prior Publication Data
US 2005/0075053 A1 Apr. 7, 2005

(30) Foreign Application Priority Data
Oct. 2, 2003 (KR) ............... 10-2003-0068855

(51) Int. Cl.
*B24B 10/00* (2006.01)
*H01L 21/00* (2006.01)
(52) U.S. Cl. ............... 451/41; 438/69; 451/54
(58) Field of Classification Search .......... 257/290, 257/291, 292, 294, 432; 438/59, 65, 69, 438/73; 451/41, 54, 59, 63
See application file for complete search history.

(56) References Cited

U.S. PATENT DOCUMENTS

| | | | |
|---|---|---|---|
| 6,369,417 B1 | 4/2002 | Lee | |
| 6,506,681 B2 * | 1/2003 | Grigg et al. | 438/692 |
| 6,638,837 B1 * | 10/2003 | Tsao et al. | 438/459 |
| 6,794,751 B2 * | 9/2004 | Kumamoto | 257/738 |
| 6,808,960 B2 * | 10/2004 | Yamamoto | 438/107 |
| 6,864,172 B2 * | 3/2005 | Noma et al. | 438/674 |
| 6,916,680 B2 * | 7/2005 | Lee et al. | 438/70 |

FOREIGN PATENT DOCUMENTS

KR 10-2003-0060603 7/2003

* cited by examiner

*Primary Examiner*—Timothy V. Eley
(74) *Attorney, Agent, or Firm*—Andrew D. Fortney

(57) ABSTRACT

Back grinding methods for fabricating an image sensor are disclosed. An example method of back grinding an image sensor comprises: forming a profile anti-deformation film on a micro lens of the image sensor; grinding a backside of a semiconductor substrate of the image sensor; and removing the profile anti-deformation film.

8 Claims, 5 Drawing Sheets

BACK GRINDING METHODS FOR FABRICATING AN IMAGE SENSOR

FIELD OF THE DISCLOSURE

The present disclosure relates generally to image sensors, and more particularly, to back grinding methods for fabricating an image sensor.

BACKGROUND

In general, image sensors are semiconductor devices for converting an optical image into an electrical signal. Charge coupled device (CCD) image sensors and CMOS image sensors are known.

Efforts to increase the photosensitivity of image sensors have been made. One such effort has resulted in a light concentration technique. Consider, for example, a CMOS image sensor which comprises a photo-detecting element and a logic circuit for converting sensed light into an electrical signal for datalization of the sensed light. The photo-detecting element typically includes photodiodes.

To increase the photosensitivity of such a CMOS image sensor, the ratio of the area of the photo-detecting element relative to the entire area of the CMOS image sensor (referred to as "fill factor" typically) must be increased. Unfortunately, the amount by which the area of the photo-detecting element may be increased is limited, since the photo-detecting area can only be formed within the portion of the CMOS image sensor which is not occupied by the logic circuit.

Accordingly, many light concentration techniques have been studied which change the path of light incident on the region(s) of the CMOS image sensor which are not occupied by the photo-detecting element to concentrate the light on the optical sensing element. One such light concentration technique is to form micro lenses on an upper portion of a color filter of the CMOS image sensor using material having good transmittance. In this approach, the micro lenses refract the path of the incident light to transport a higher amount of light to the optical sensing element.

Recently, as the use of image sensors has spread to digital cameras and mobile phones, efforts to reduce the size of the image sensors and, hence, the entire size of the package have been made. However, since a wafer of the image sensor is about 800 µm thick, the thickness of the wafer must be reduced in order to reduce the size of the image sensor. To accomplish this thickness reduction, the image sensor is subjected to a back grinding process to grind a backside of the wafer before the image sensor is packaged.

As shown in FIGS. 1a and 1b, conventionally, this back grinding process is performed after an adhesive tape 104 for back grinding is adhered to surfaces of the micro lenses 102 of the image sensor 100. FIG. 1a illustrates a semiconductor substrate 106 having an optical sensing means such as a photodiode (not shown). An oxide film 108, a nitride film 110, a planarization layer 112, a color filter array 114, and an over coating material (OCM) layer 116 are sequentially stacked on the substrate 106. The oxide film 108 and the nitride film 110 are provided to protect elements from extraneous humidity or scratches. The OCM layer 116 is formed with an insulation film of the resist, oxide film or nitride film family for protecting the color filter array 114, fabricating the micro lenses 102 uniformly, and adjusting the focal length of the micro lenses 102.

However, as shown in FIG. 1B, a problem arises in the above-described method in that the profile of the micro lenses 102 is deformed. This deformation leads to deterioration of the performance of the micro lenses 102.

To overcome this problem, a prior art method has been developed wherein a spacer 118 is arranged on the surface of the semiconductor substrate 106, and the back grinding is performed after a glass plate 120 is adhered on the spacer 118 as shown in FIG. 2. (Reference numerals in FIG. 2 are the same as those in FIG. 1a, and the explanation of the corresponding structures will be omitted for the sake of brevity.) The method of FIG. 2 is disadvantageous, however, in that additional processes are required due to the spacer 118 and the glass plate 120 and in that chip loss inevitably occurs.

BRIEF DESCRIPTION OF THE DRAWINGS

FIG. 1b is a schematic view illustrating a problem associated with the method of FIG. 1a.

DETAILED DESCRIPTION

Figure 3A:
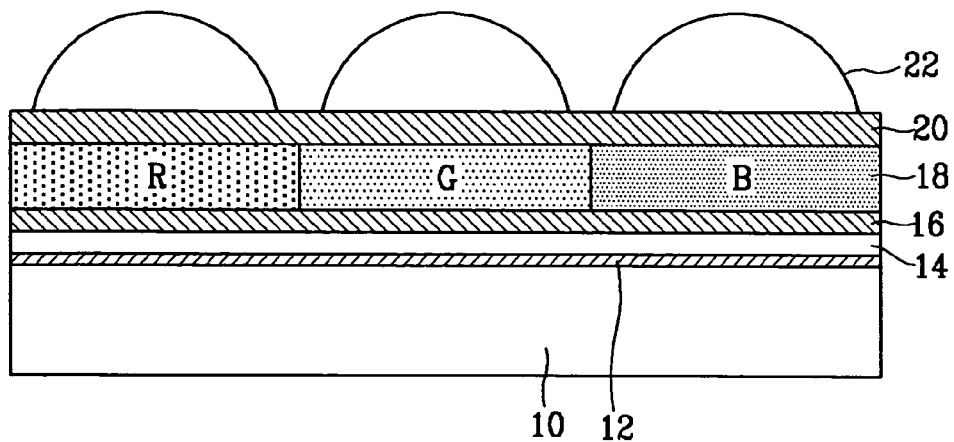
FIGS. 3a to 3f are schematic views illustrating an example back grinding method for an image sensor performed in accordance with the teachings of the present invention.

FIGS. 3a to 3f illustrate an example back grinding method of an image sensor. As shown in FIG. 3a, the image sensor includes a semiconductor substrate 10. Optical sensing elements (not shown) such as photodiodes are provided in a device region of the semiconductor substrate 10. An oxide film 12 and a nitride film 14 are sequentially formed or deposited on a structure where the optical sensing elements are formed. A planarization layer 16 for improving adhesion is provided on the nitride film 14. The planarization layer 16 can be removed, and the oxide film 12 and the nitride film 14 serve to protect devices from extraneous humidity or scratches.

In addition, a color filter array 18 including red (R), green (G) and blue (B) color filters is provided on the planarization layer 16. An OCM layer 20 is provided on the color filter array 18. The OCM layer 20 is formed with an insulation film of the resist, oxide film or nitride film family for protecting the color filter array 18, fabricating micro lenses 22 uniformly, and adjusting the focal length of the micro lenses 22. The micro lenses 22 are provided on the OCM layer 20 for concentrating external light on the color filters R, G and B.

When the back grinding process is performed to reduce the size of the image sensor of FIG. 3A, it is important to prevent profile deformation of the micro lenses 22 and the resulting chip loss. To this end, new back grinding methods will now be disclosed.

Figure 3B:
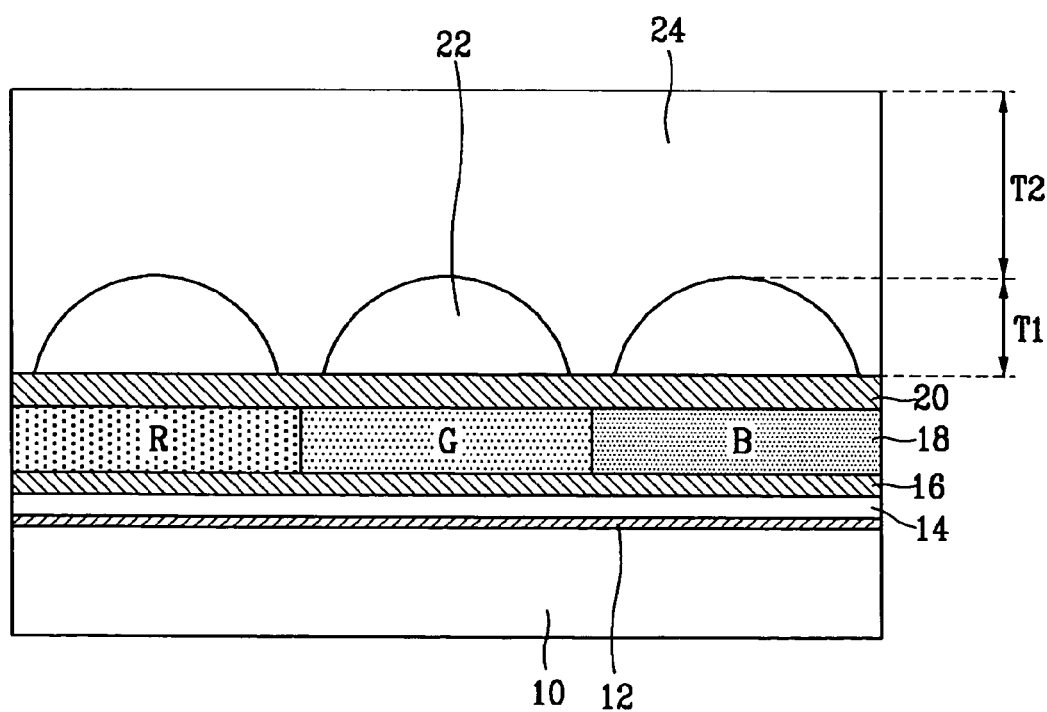

As shown in FIG. 3b, a profile anti-deformation film 24 is formed on the micro lenses 22. The profile anti-deformation film 24 can be formed through a post-process such as a heat treatment process performed after coating a typical photoresist on the micro lenses 22. The thickness (T2) of the portion of the profile anti-deformation film 24 above the micro lenses 22 should be, for example, more than two times (preferably two to three times) the thickness T1 of the micro lenses 22.

The reason for the restriction on the thickness (T2) of the profile anti-deformation film 24 is that the profile deformation of the micro lenses 22 due to grinding pressure when the back grinding operation is performed can be effectively prevented if the thickness (T2) of the profile anti-deformation film 24 is more than two times the thickness T1 of the micro lenses 22. The thickness T2 of the profile anti-deformation film 24 is the thickness from the uppermost point of the micro lenses 22 to the top of the film 24, as shown in FIG. 3b.

Figure 3C:
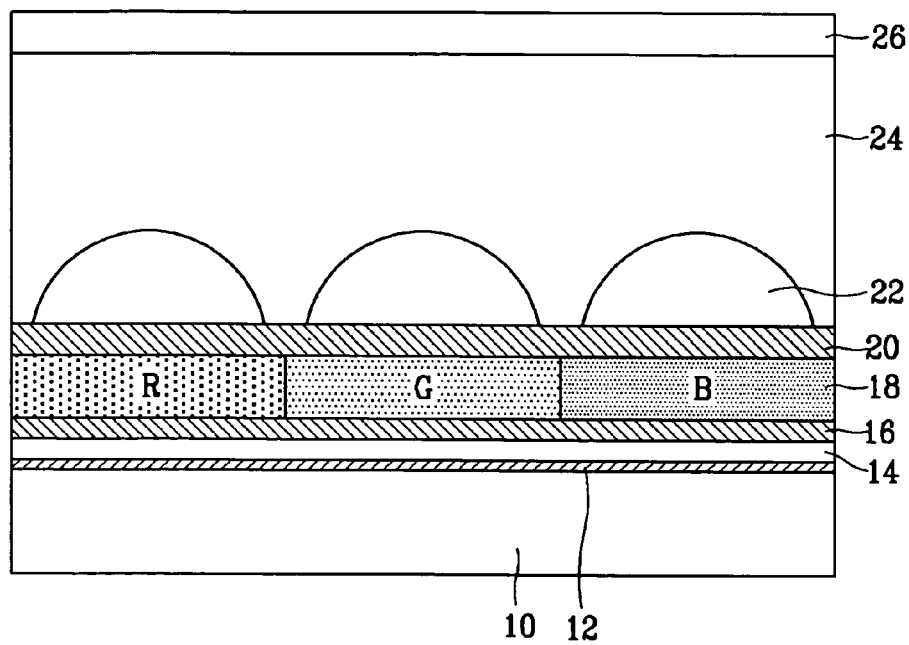
Figure 3D:
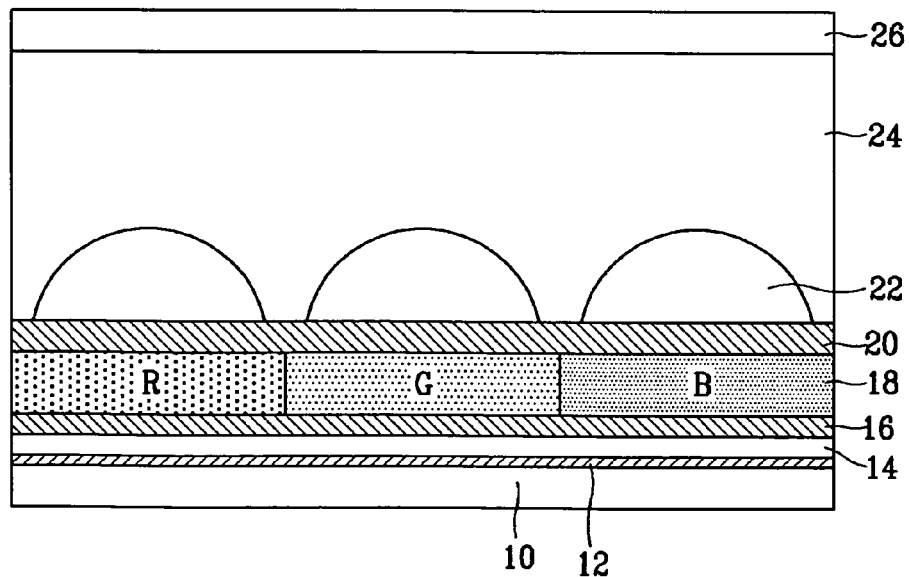

Subsequently, as shown in FIG. 3c, after an adhesive tape 26 for back grinding is adhered on a surface of the profile anti-deformation film 24, a backside of the semiconductor substrate 10 is back grinded using back grinding equipment. The back grinded image sensor is shown in FIG. 3d. Note the reduction in the thickness of the substrate 10 by comparing FIGS. 3c and 3d.

Figure 3E:
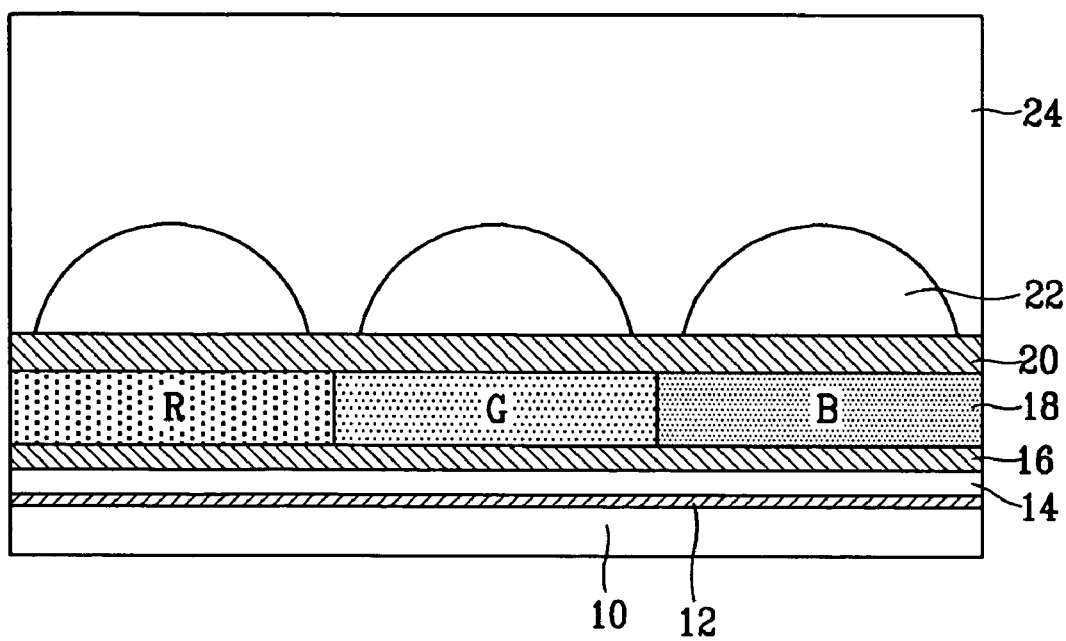
Figure 3F:
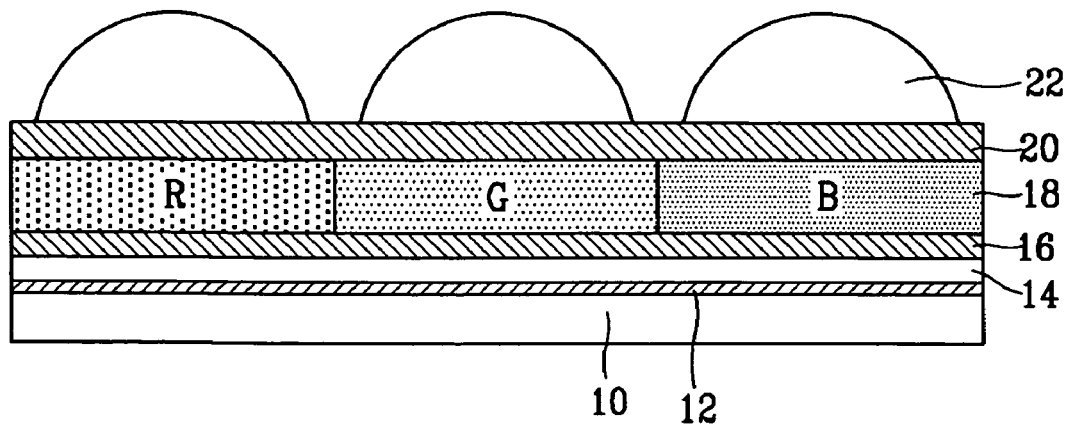

Next, after completing the back grinding operation, the adhesive tape 26 is removed as shown in FIG. 3e. Subsequently, the profile anti-deformation film 24 is removed using chemicals as shown in FIG. 3f.

By employing the example method described above, a back grinded image sensor with the original profile of the micro lenses 22 maintained can be obtained.

Figure 1A:
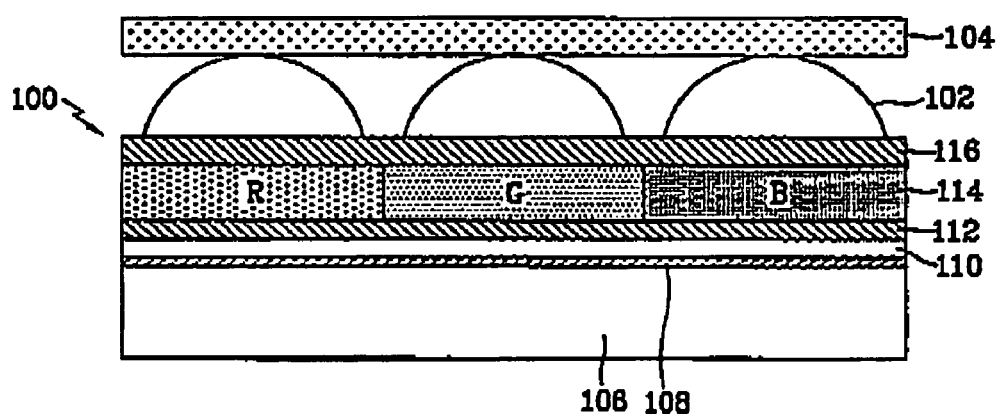
FIG. 1a is a schematic view illustrating a conventional back grinding method for an image sensor.
Figure 1B:
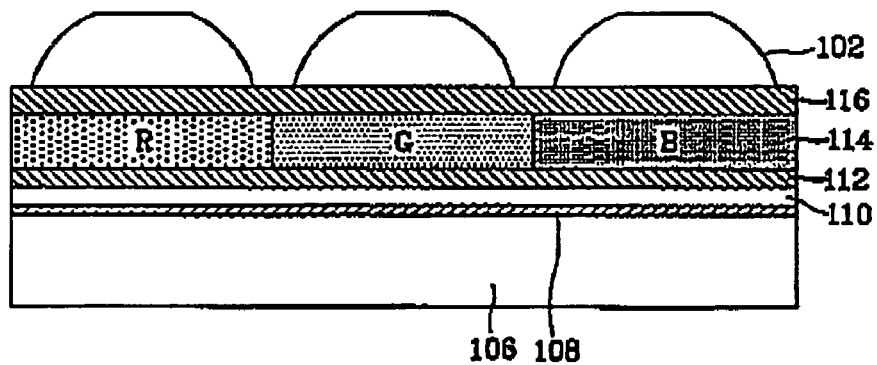
Figure 2:
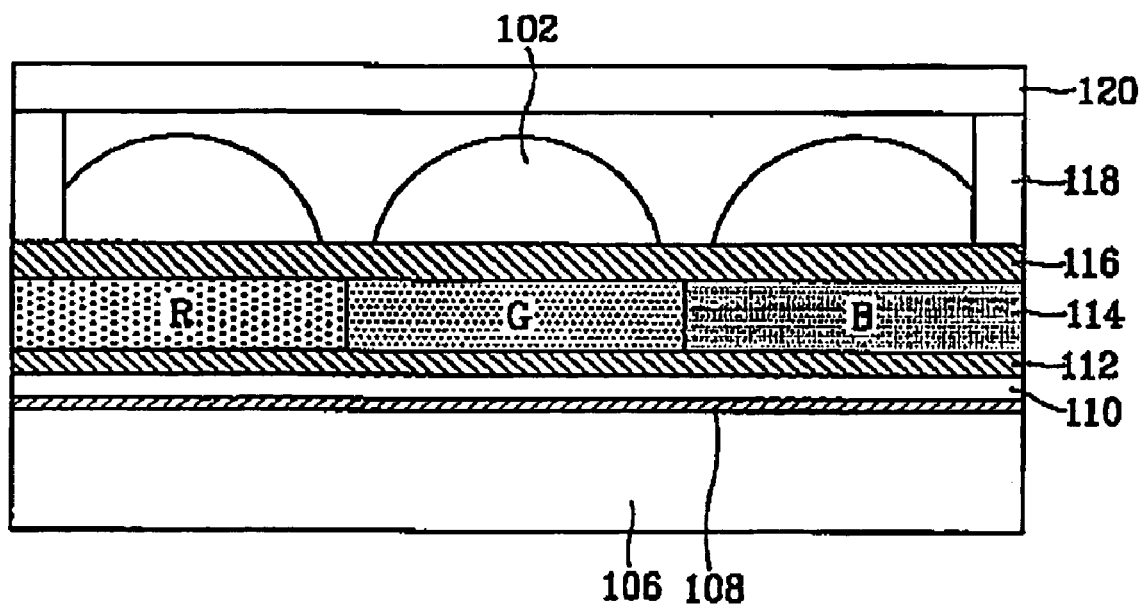
FIG. 2 is a schematic view of another conventional back grinding method for an image sensor.

As is apparent from the above description, the illustrated back grinding methods are advantageous in that the profile deformation of the micro lenses 22 can be effectively prevented, while process simplification and cost reduction as compared to the conventional back grinding method using the glass plate (e.g., the method illustrated in FIG. 2) are achieved, In addition, the illustrated back grinding methods are advantageous in that the methods can be widely used, irrespective of the kinds of optical sensing means and image sensors. Various materials may be used for the profile anti-deformation film 24, and various kinds of chemicals may be used to remove the profile anti-deformation film 24.

From the foregoing, persons of ordinary skill in the art will appreciate that back grinding methods have been provided for preventing profile deformation of the micro lenses of an image sensor and the chip loss resulting from such deformation which commonly occur in the prior art when the image sensor is subject to a back grinding process.

An illustrated method for back grinding a semiconductor substrate of an image sensor comprises: forming a profile anti-deformation film 24 on micro lenses 22; providing an adhesive 26 on the profile anti-deformation film 24; and grinding the backside of the semiconductor substrate 10 of the image sensor to remove a predetermined thickness of the backside of the substrate 10.

Preferably, the profile anti-deformation film 24 has a thickness that is more than two times (more preferably, two to three times) the thickness of the micro lenses 22 in order to effectively prevent profile deformation of the micro lenses 22 due to a pressure generated when grinding the backside of the semiconductor substrate 10.

Preferably, the profile anti-deformation film 24 is formed of a photoresist or another material having other properties. In effect, the profile anti-deformation film 24 has no significant limit to the material properties.

Preferably, after grinding the backside of the semiconductor substrate 10, the adhesive 26 is removed, the profile anti-deformation film 24 is removed, and then a conventional packaging process is performed.

It is noted that this patent claims priority from Korean Patent Application Serial Number 10-2003-0068855, which was filed on Oct. 02, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of back grinding an image sensor comprising:
   forming a profile anti-deformation film comprising a photoresist on a micro lens of the image sensor, wherein a portion of the profile anti-deformation film above the micro lens is two to three times as thick as the micro lens;
   grinding a backside of a semiconductor substrate of the image sensor; and
   removing the profile anti-deformation film.

2. A method as defined in claim 1, wherein forming the profile anti-deformation film comprises coating a photoresist on the micro lenses and then solidifying the photoresist.

3. A method as defined in claim 1, further comprising providing an adhesive on the profile anti-deformation film.

4. A method as defined in claim 3, further comprising removing the adhesive after grinding the backside of the semiconductor substrate.

5. A method as defined in claim 3, wherein the adhesive comprises an adhesive tape.

6. A method as defined in claim 1, wherein removing the profile anti-deformation film comprises chemically removing the profile anti-deformation film.

7. A method as defined in claim 1, wherein the profile anti-deformation film and the micro lens have a combined thickness of 3 to 4 times a thickness of the micro lens at its uppermost point.

8. A method as defined in claim 1, wherein the profile anti-deformation film has a thickness from the uppermost point of the micro lens to the top of the profile anti-deformation film that is two to three times as thick as the micro lens at the uppermost point.

* * * * *